(12) United States Patent  
Nakura et al.

(10) Patent No.: US 6,534,358 B2
(45) Date of Patent: Mar. 18, 2003

(54) METHOD OF FABRICATING SEMICONDUCTOR DEVICE HAVING FERROELECTRIC CAPACITOR

(75) Inventors: Takeshi Nakura, Tokyo (JP); Hidemitsu Mori, Tokyo (JP); Seiichi Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/838,186

(22) Filed: Apr. 20, 2001

(65) Prior Publication Data

US 2001/0034069 A1 Oct. 25, 2001

(30) Foreign Application Priority Data

Apr. 21, 2000 (JP) ........................................ 2000-121541

(51) Int. Cl.[7] .......................................... H01L 21/8242
(52) U.S. Cl. ........................... 438/240; 438/3; 438/250; 438/256; 438/393
(58) Field of Search ............................. 438/3, 239, 240, 438/250, 253, 256, 393, 396, 399, 575, 582, 618, 622, 626, 637, 648, 660, 663

(56) References Cited

U.S. PATENT DOCUMENTS 6,322,849 B2 * 11/2001 Joshi et al. ..................... 438/3

FOREIGN PATENT DOCUMENTS

| JP | 11-111930 | 4/1999 |
| JP | 11-317500 | 11/1999 |
| JP | 2001-257322 | 9/2001 |

* cited by examiner

*Primary Examiner*—Tuan H. Nguyen
*Assistant Examiner*—Jack Chen
(74) *Attorney, Agent, or Firm*—Young & Thompson

(57) ABSTRACT

An interlayer insulating film, contacts, and wirings are formed on a MOS transistor formed on a silicon substrate. Another interlayer insulating film and contacts are formed thereon. Subsequently, as a first heat treatment, a heat treatment is performed in a hydrogen atmosphere or a nitrogen- or otherwise-diluted hydrogen atmosphere at a temperature of the order of 300–500° C. for about 5–60 minutes, thereby recovering defects that occur in the MOS transistor and insulating film forming steps and the like. Then, a ferroelectric capacitor connected to either diffusion layer of the MOS transistor is formed along with wirings, electrodes, and the like. Thereafter, as a second heat treatment, a heat treatment is performed in nitrogen at a temperature of the order of 300–500° C. for about 5–60 minutes. This recovers defects that occur after the first heat treatment step.

10 Claims, 6 Drawing Sheets

METHOD OF FABRICATING SEMICONDUCTOR DEVICE HAVING FERROELECTRIC CAPACITOR

BACKGROUND OF THE INVENTION

1. Field of the Invention

The present invention relates to a method of fabricating a semiconductor device having a ferroelectric capacitor that includes a ferroelectric film as its dielectric. In particular, the invention relates to a method of fabricating a semiconductor device having a ferroelectric capacitor, for recovering a deterioration of MOS (Metal Oxide Semiconductor) transistor characteristics occurring in fabrication processes.

2. Description of the Related Art

Conventionally, among important factors for semiconductor devices is an improvement of the deterioration in transistor characteristics resulting from in-process defects.

Transistor-including memories, at their final processes, are typically subjected to heat treatment in a hydrogen atmosphere. This heat treatment aims to terminate defects in the interfaces between the gate oxide films of the transistors and the substrates with diffused hydrogen so that the gate oxide films are lowered in interface state density for stable transistor characteristics.

Accordingly, this hydrogen-based heat treatment is the last to be performed in the fabrication processes. Nevertheless, since the oxide electrodes and ferroelectrics that form commonly-used ferroelectric capacitors are oxides, there has been a problem that the hydrogen-based heat treatment causes reduction of the ferroelectrics with deterioration in the characteristics.

More specifically, due to the application of the hydrogen treatment, the ferroelectrics, or the oxides used in the ferroelectric capacitors, are reduced to substances showing no ferroelectric-specific properties. This makes the ferroelectric capacitors unavailable. However, particularly to a so-called logic mixed ferroelectric memory in which both memory units composed of ferroelectric capacitors and logic circuit units are formed on a single chip, the heat treatment in hydrogen is an indispensable process for the sake of maintaining the characteristics of the logic circuit units.

For example, Japanese Patent Laid-Open Publication No. Hei 11-111930 discloses a method of fabricating a semiconductor device for preventing a deterioration of ferroelectric properties and an increase in leak current resulting from a heat treatment in an atmosphere of hydrogen-containing inert gas after the formation of an upper electrode (conventional example 1).

The technology of the conventional example 1 provides a method of fabricating a semiconductor memory device comprising: a MOS transistor to be a switching transistor formed on a semiconductor substrate; and a capacitor having a ferroelectric film as its dielectric and being electrically connected to the MOS transistor via a contact hole formed in a first insulating film. The semiconductor memory device is connected to another semiconductor device through wiring. In the method, between the formation of the dielectric film on a lower electrode of the capacitor and the formation of an upper electrode, a first heat treatment is performed in a hydrogen atmosphere at a temperature of 300–450° C. so as to terminate defects in the interface between a gate insulating film of the MOS transistor and the semiconductor substrate. Moreover, the upper electrode of the capacitor is formed on the ferroelectric film and an interlayer insulating film is formed thereon, followed by the formation of contact holes and the formation of wiring for establishing connection between the MOS transistor and the other semiconductor memory device. Then, a surface protective layer is formed, and a second heat treatment of 300–450° C. in temperature is performed in an oxygen atmosphere or in an atmosphere of mixed gas of oxygen and inert gas. This recovers the plasma damage introduced in the steps of opening the contact holes, installing metal wiring, and forming the surface protective film.

Moreover, for example, Japanese Patent Laid-Open Publication No. Hei 11-317500 discloses the application of heat treatment in hydrogen between the formation of multilayer wiring and the formation of ferroelectric capacitors (conventional example 2). A semiconductor device according to the conventional example 2 includes a plurality of pieces of metal wiring, a ceramic thin-film capacitor consisting of a lower electrode, a ceramic thin film, and an upper electrode, and a selecting transistor. Here, the selecting transistor is formed on a silicon substrate, a contact connected to this selecting transistor is formed, and the metal wiring is installed. Then, the semiconductor device is subjected to a heat treatment in a hydrogen-containing atmosphere, followed by the formation of the ceramic thin-film capacitor. Accordingly, via hole having tungsten plug need not be formed after the formation of the ceramic thin-film capacitor. This can prevent the ceramic capacitor from deteriorating in the step of tungsten CVD. In addition, the hydrogen-based heat treatment can decrease deterioration of the transistor.

In the technology of the conventional example 1, the hydrogen treatment (first heat treatment) is performed between the formation of the ferroelectric film and the formation of the upper electrode for the sake of preventing the deterioration of the ferroelectric film. This means a problem, however, that the hydrogen treatment inevitably deteriorates the properties of the ferroelectric film as long as the hydrogen heat treatment is performed after the formation of the ferroelectric film.

Meanwhile, the technology of the conventional example 2 has had a problem that defects occur in the step of forming the ferroelectric capacitor, thereby producing variations in the transistor characteristics.

SUMMARY OF THE INVENTION

An object of the present invention is to provide a method of fabricating a semiconductor device having a ferroelectric capacitor, in which transistor characteristics equivalent to those when the hydrogen-based heat treatment is performed at the last step can be obtained without a deterioration in ferroelectric properties.

The method of fabricating a semiconductor device having a ferroelectric capacitor according to the present invention is for fabricating a semiconductor device that includes a ferroelectric film as its dielectric. The method includes the steps of performing-a first heat treatment in a hydrogen-containing atmosphere to recover a defect occurring in a film forming step, forming the ferroelectric capacitor, and performing a second heat treatment in a nitrogen atmosphere to recover a defect occurring in the step of forming the ferroelectric capacitor.

According to the present invention, in the fabrication processes for forming a ferroelectric capacitor, the first heat treatment to precede the formation of the ferroelectric capacitor is performed in a hydrogen atmosphere, so as to recover defects that occur at the fabrication processes before the first heat treatment, in the oxide films of the MOS transistor or the like, or in the interfaces of the electrodes, oxide films, or the like. Then, the second heat treatment in a nitrogen atmosphere recovers defects that occur in the step of forming the ferroelectric capacitor. This makes it possible to recover defects occurring in the fabrication processes without deteriorating the ferroelectric capacitor by the hydrogen treatment.

Moreover, in the present invention, the first heat treatment step may follow the step of forming a MOS transistor on the surface of a silicon substrate, and the step of forming a first insulating film on this MOS transistor and forming a contact connected to a diffusion layer in the MOS transistor. The step of forming a lower electrode on the first insulating film, a ferroelectric film thereon, and an upper electrode thereon to form a ferroelectric capacitor, the lower electrode being connected to the contact, and the step of forming a second insulating film over the entire surface and forming a wiring for establishing connection between the contact and the upper electrode may be interposed between the first heat treatment step and the second heat treatment step. The step of forming a plurality of wiring layers between the contact and the ferroelectric capacitor may also lead the first heat treatment step.

Furthermore, the first heat treatment step may follow the step of forming a MOS transistor on the surface of a silicon substrate, the step of forming a third insulating film on this MOS transistor, and the step of forming a contact connected to a diffusion layer in the MOS transistor. Between the first heat treatment step and the second heat treatment step may be interposed the step of forming a ferroelectric capacitor consisting of a lower electrode on the third insulating film, a ferroelectric film thereon, and an upper electrode thereon, and the step of forming a fourth insulating film and forming a wiring for establishing connection between the contact and the upper electrode. The lower electrode of the ferroelectric capacitor may be connected to the contact.

The first and second heat treatments in the present invention may be performed at a temperature of 300–500° C.

DETAILED DESCRIPTION OF THE PREFERRED EMBODIMENT

Hereinafter, embodiments of the present invention will be described in detail with reference to the drawings. The present invention features the separate application of two heat treatments to a semiconductor device having a ferroelectric capacitor, so as to recover deterioration in the characteristics of transistors or the like occurring in the fabrication processes without ill effects on the ferroelectric capacitor. FIGS. 1A through 1H are sectional views showing, in order of steps, the method of fabricating a semiconductor device having a ferroelectric capacitor according to the first embodiment of the present invention. Here, FIGS. 1A–1H show a ferroelectric memory region A and a logic circuit region B.

Figure 1A:
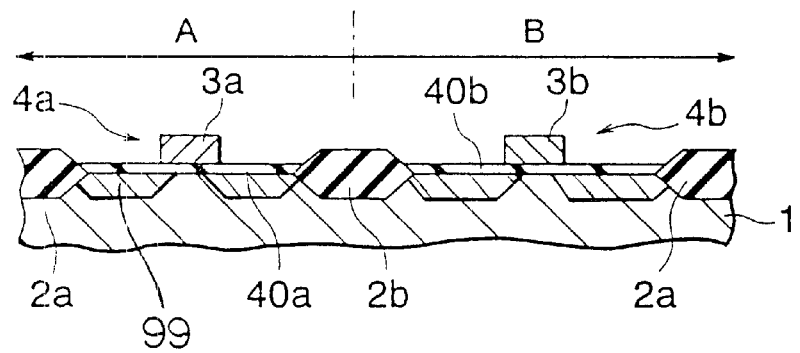
FIGS. 1A through 1H are sectional views showing, in order of steps, the method of fabricating a semiconductor memory device having a ferroelectric capacitor according a first embodiment of the present invention.

As shown in FIG. 1A, element isolation insulating films $2a$ and $2b$ are formed on the surface of a silicon substrate 1 to be the ferroelectric memory region A and the logic circuit region B, by using publicly-known techniques. Gate insulating films $40a$ and $40b$ are formed on the substrate, in element regions defined by these element isolation insulating films $2a$ and $2b$. Gate electrodes $3a$ and $3b$ are formed in a predetermined position on the respective element regions. With these gate electrodes $3a$ and $3b$ as the masks, ion implantation is performed on the substrate surface to form diffusion layers 99 (not shown in remaining drawing figures) to be source and drain regions on the substrate surface. As a result, transistors $4a$ and $4b$ are formed in the ferroelectric memory region A and the logic circuit region B, respectively. In the present embodiment, the element isolation insulating film $2b$ isolates the ferroelectric memory region A and the logic circuit region B from each other.

Figure 1B:
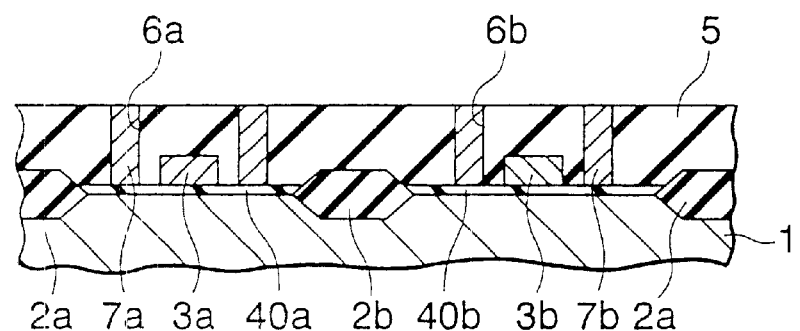

As shown in FIG. 1B, an interlayer insulating film 5 and the wiring are formed by using publicly-known techniques, over the MOS transistors $4a$ and $4b$ formed on this silicon substrate 1. Initially, the interlayer insulating film 5 chiefly composed of e.g. $SiO_2$ is deposited on by a plasma CVD or thermal CVD method. Thereafter, through holes $6a$ and $6b$ for forming electrodes connected to the diffusion layers in the source and drain regions of the ferroelectric memory region A and electrodes connected to the gate $3b$ of the transistor $4b$ and the diffusion layers in the source and drain regions of the logic circuit region B, respectively, are made by dry etching or the like. Then, such a conductive as tungsten or polysilicon is embedded into the through holes $6a$ and $6b$ to form contacts $7a$ and $7b$, respectively.

Figure 1C:
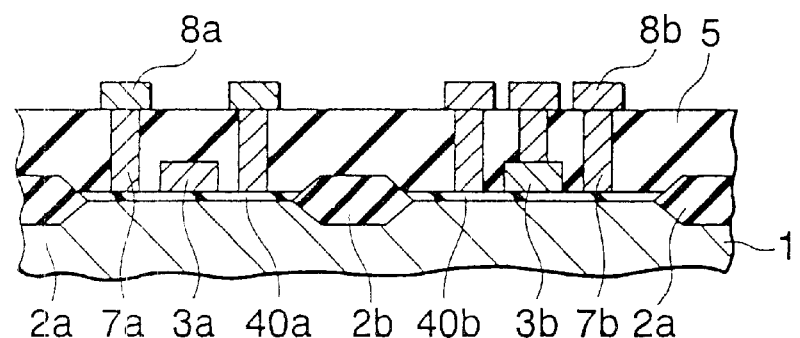

Next, as shown in FIG. 1C, a laminated layer of e.g. Al, Ti, TiN, or the like is formed. Then, first wirings $8a$ and $8b$ connected to the contacts $7a$ and $7b$, respectively, are formed on this laminated layer by using publicly-know lithographic techniques and etching techniques.

Figure 1D:
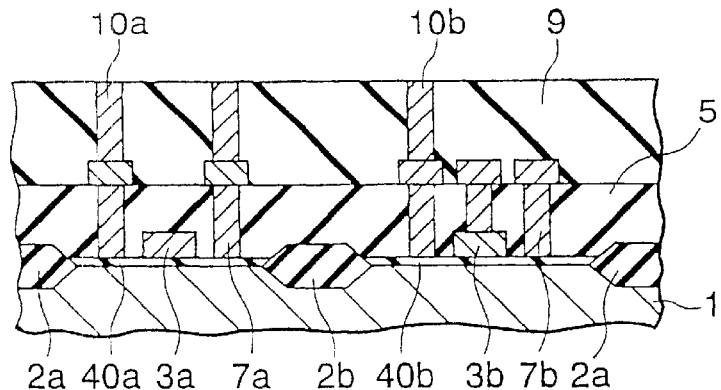

Thereafter, as shown in FIG. 1D, an interlayer insulating film 9 is formed like the interlayer insulating film 5, followed by the formation of through holes for forming electrodes connected to the first wirings $8a$ and $8b$. These through holes are filled with such a conductive as tungsten, to form contacts $10a$ and $10b$, respectively.

Figure 1E:
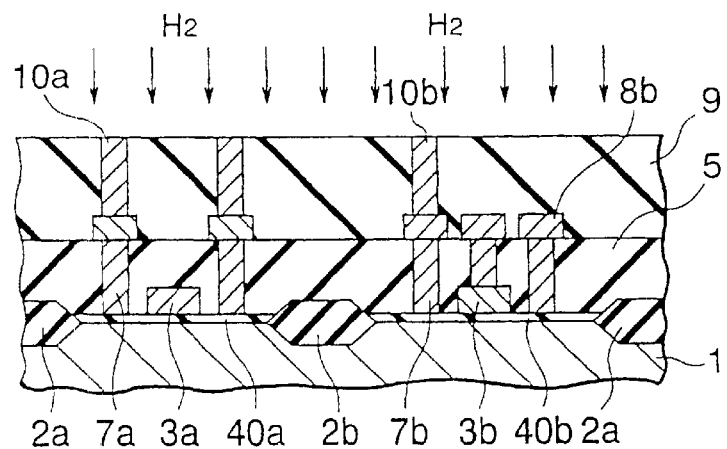

Here, as shown in FIG. 1E, a first heat treatment according to the present invention is performed in a hydrogen atmosphere or a nitrogen- or otherwise-diluted hydrogen atmosphere at a temperature of the order of 300–500° C. for about 5–60 minutes. Due to the etching and the heat, plasma, or other effects during the formation of the individual films, defects occur in the oxide films that constitute the interlayer insulating films 5 and 9, or in the interfaces of the electrodes and the like. These defects cause the deterioration of transistor characteristics. It is publicly known that the application of a heat treatment in hydrogen recovers these defects. If the hydrogen-based heat treatment is performed at the final step of the fabrication processes as heretofore, the oxide electrodes and ferroelectrics that form typically-used ferroelectric capacitors would be reduced by hydrogen, with a deterioration in characteristics because of being oxides. In the present invention, however, the hydrogen treatment is performed at this stage immediately before the formation of a ferroelectric capacitor. This makes it possible to recover the above-mentioned defects that have occurred by the first heat treatment step without ill effects to the ferroelectric.

Figure 1F:
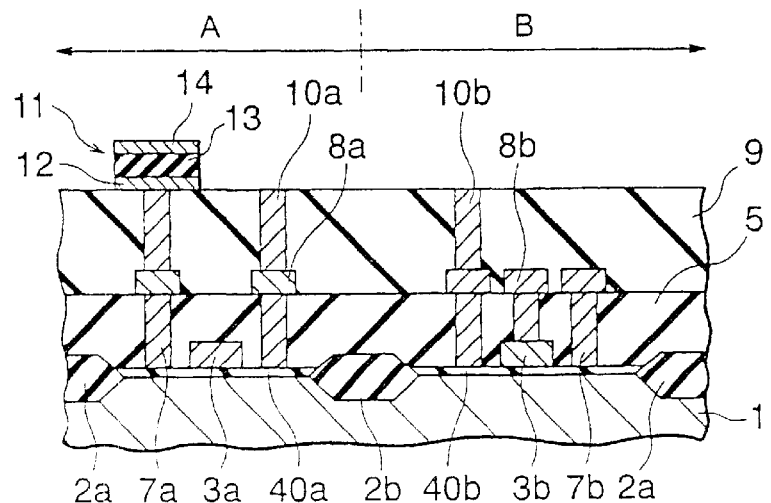

Next, as shown in FIG. 1F, a ferroelectric capacitor 11 connected to a contact 10a in the ferroelectric memory region A is formed. The ferroelectric capacitor 11 is formed by laminating a lower electrode 12, a ferroelectric film 13, and an upper electrode 14 in succession. The ferroelectric film 13 is a ferroelectric chiefly composed of, for example, lead zirconate titanate (Pb(Zr,Ti)O$_3$; hereinafter, PZT), SrBi$_2$Ta$_2$O$_9$ (hereinafter, SBT), or the like. Such additives as La, Ca, Sr, and Nb may be added thereto. The methods of forming the ferroelectric film include a CVD method, sputtering method, and sol-gel method. The electrodes of the ferroelectric capacitor may be of Pt, Ir, IrO$_2$, Ru, RuO$_2$, SrRuO$_3$, or the like, or laminated films thereof. The electrodes are formed chiefly by sputtering or the like.

Figure 1G:
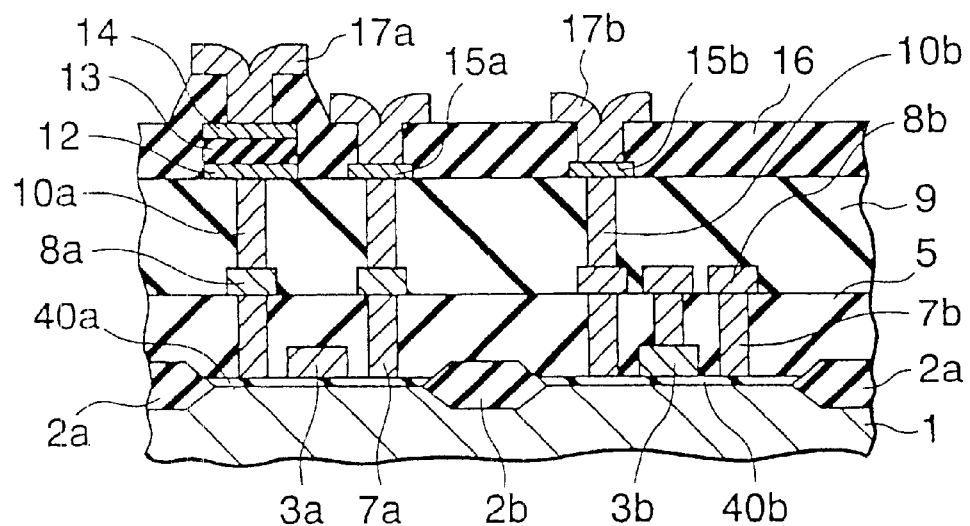

Subsequently, as shown in FIG. 1G, wirings 15a and 15b connected to the contact 10a that is in connection with the other diffusion layer of the MOS transistor 4a and a contact 10b in the logic circuit region B, respectively, are formed. An interlayer insulating film 16 is formed, for example, by a CVD or other method using O$_3$-TEOS (tetraethoxysilane: Si(OC$_2$H$_5$)$_4$) which causes less damage to the ferroelectric capacitor 11. After the formation of an Al, Ti, TiN, Pt, Ir, or other film, or a laminated film thereof, wirings 17a and 17b connected to the upper electrode 14 of the ferroelectric capacitor 11 and the wirings 15a and 15b, respectively, are formed.

Figure 1H:
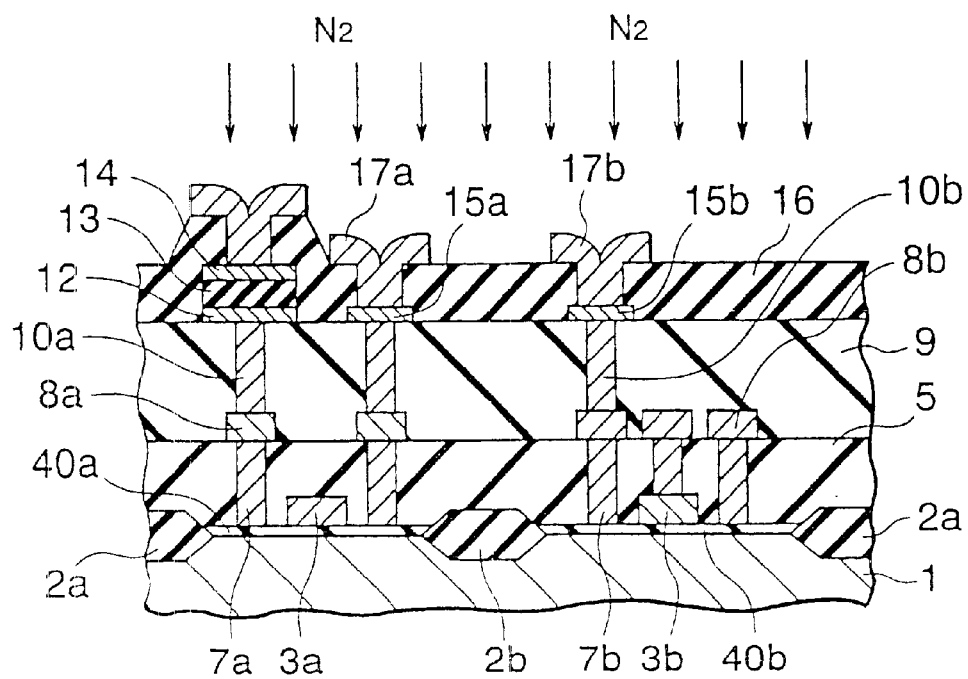

Then, as shown in FIG. 1H, a second heat treatment according to the present invention is -performed in nitrogen at a temperature of the order of 300–500° C. for about 5–60 minutes. Here, the recovery is required only of the defects produced in the steps.after the first heat treatment. What is more, the first heat treatment step takes only a short time, and the hydrogen resulting from the first heat treatment still exists in the individual films. Therefore, the heat treatment in nitrogen can achieve sufficient recovery of the defects mentioned above.

In the present embodiment, the first heat treatment in hydrogen which greatly deteriorates the properties of the ferroelectric is performed immediately after the formation of the wirings of the logic circuit region B, or before the formation of the ferroelectric capacitor. This makes it possible to recover transistor characteristics without deteriorating the properties of the ferroelectric. Moreover, the hydrogen-based first heat treatment is followed by the steps of forming the ferroelectric capacitor and forming its connection wirings. This means a smaller effect on the logic circuit region B. Furthermore, the second heat treatment in nitrogen is performed after the first heat treatment in hydrogen. Therefore, the presence of hydrogen in the individual films allows effective operation of the second heat treatment as well as recovery of the damage caused in the steps of forming the ferroelectric capacitor and the connection wirings connected thereto. As a result, the defects in the oxide films and electrode interfaces occurring in the fabrication processes of the semiconductor device can be recovered without deterioration of the ferroelectric properties, thereby offering highly excellent transistor characteristics.

Figure 2:
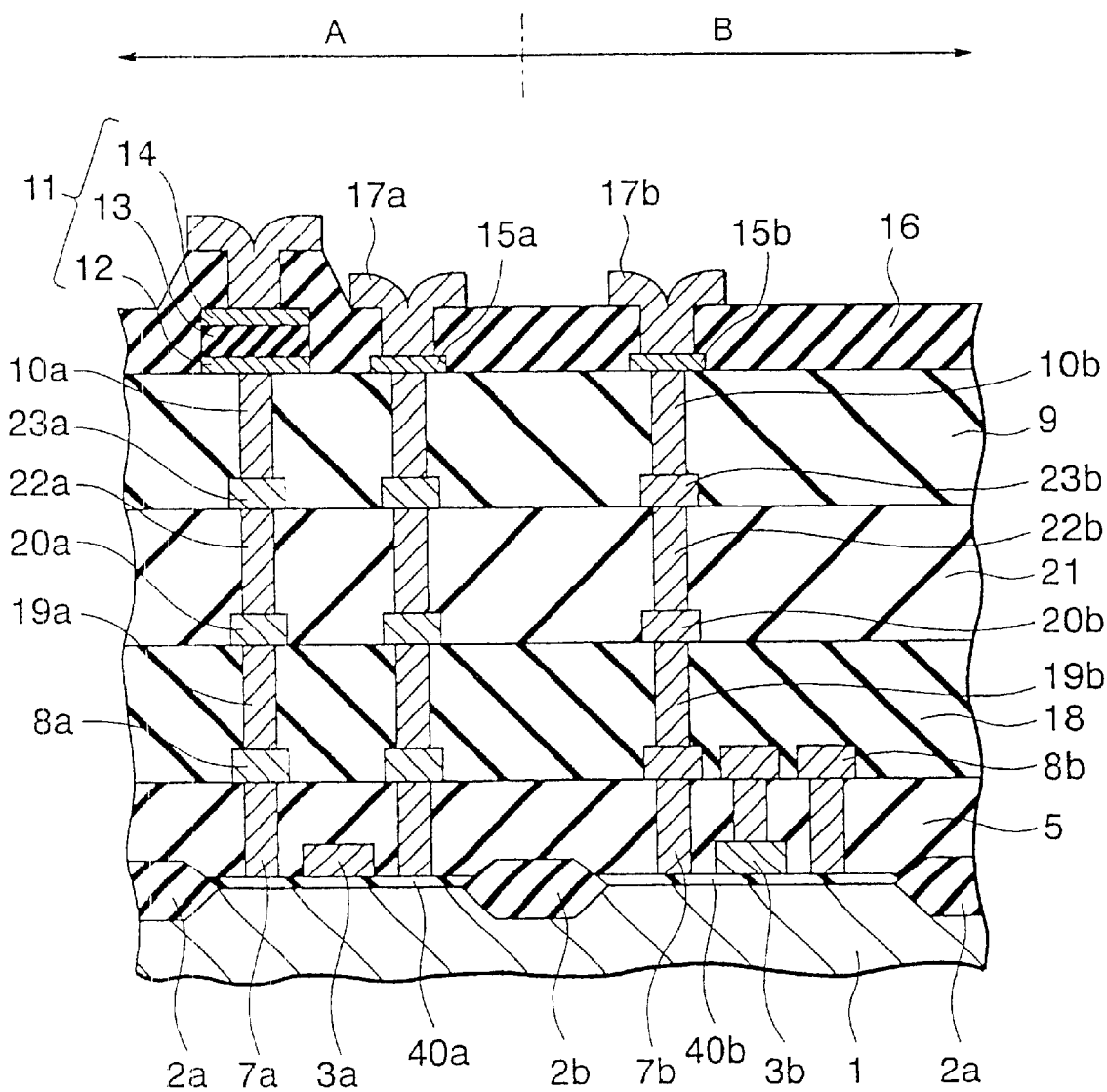
FIG. 2 is a sectional view of a semiconductor device having a ferroelectric capacitor fabricated by a second embodiment of the present invention.

Now, description will be given of the second embodiment. FIG. 2 is a sectional view of a semiconductor device having a ferroelectric capacitor according to the second embodiment of the present invention. In this embodiment, the wiring layer formed in the first embodiment is piled up in a plurality of layers. Incidentally, in the second embodiment shown in FIG. 2, the same components as those of the first embodiment shown in FIGS. 1A–1H will be designated by identical reference numerals. Detailed description thereof will be omitted.

As shown in FIG. 2, element isolation insulating films 2a and 2b are formed on the surface of a silicon substrate 1 over a ferroelectric memory region A and a logic circuit region B. Gate insulating films 40a and 40b are formed on the silicon substrate 1, in the regions defined by the element isolation insulating films 2a and 2b. Moreover, gate electrodes 3a and 3b are formed in a predetermined position on the gate insulating films 40a and 40b, respectively. Furthermore, with these gate electrodes 3a and 3b as the masks, ion implantation is applied to the surface of the silicon substrate 1, thereby forming source and drain regions (not shown) to form transistors 4a and 4b, respectively. An interlayer insulating film 5 is deposited on these transistors 4a and 4b before contacts 7a and 7b connected to the diffusion layers in the source and drain regions and with the gate are formed thereon, respectively. First wirings 8a and 8b for establishing connection with the contacts 7a and 7b are formed on the interlayer insulating film 5.

In this embodiment, an interlayer insulating film 18 and contacts 19a, 19b connected to the first wirings 8a, 8b, respectively, are formed further on the interlayer insulating film 5. Moreover, wirings 20a and 20b for establishing connection with the contacts 19a and 19b, respectively, are formed on the interlayer insulating film 18. An interlayer insulating film 21 is formed over the entire surface, followed by the formation of contacts 22a and 22b for establishing connection with the wirings 20a and 20b. Then, on this interlayer insulating film 21 are formed wirings 23a and 23b connected to the contacts 22a and 22b, respectively. Furthermore, an interlayer insulating film 9 and contacts 10a, 10b for establishing connection with the wirings 23a, 23b, respectively, are formed. In this manner, a necessary number of wiring layers are formed.

After the formation of a plurality of wiring layers, a first heat treatment is performed in a hydrogen atmosphere or a nitrogen- or otherwise-diluted hydrogen atmosphere at a temperature of the order of 300–500° C. for about 5–60 minutes. The subsequent steps are identical to those of the first embodiment. That is, a ferroelectric capacitor 11, wirings 15a and 15b, an interlayer insulating film 16, and wirings 17a and 17b are formed before a second heat treatment is performed in nitrogen at a temperature of the order of 300–500° C. for about 5–60 minutes.

In this embodiment, the application of the first heat treatment before the ferroelectric formation makes it possible to obtain excellent transistor characteristics without any damage to the ferroelectric capacitor even when a plurality of wiring layers are formed on the transistors.

Now, description will be given of the third embodiment. FIGS. 3A through 3E are sectional views showing, in order of steps, the method of fabricating a semiconductor device having a ferroelectric capacitor according to the third embodiment of the present invention. Incidentally, in the third embodiment shown in FIGS. 3A–3E, the same components as those of the first embodiment shown in FIGS. 1A–1H will be designated by identical reference numerals. Detailed description thereof will be omitted.

While in the first embodiment the wiring is performed in advance of the capacitor forming step, the present embodiment is a method of fabricating a, semiconductor device in which the wiring is,performed after the capacitor formation.

Figure 3A:
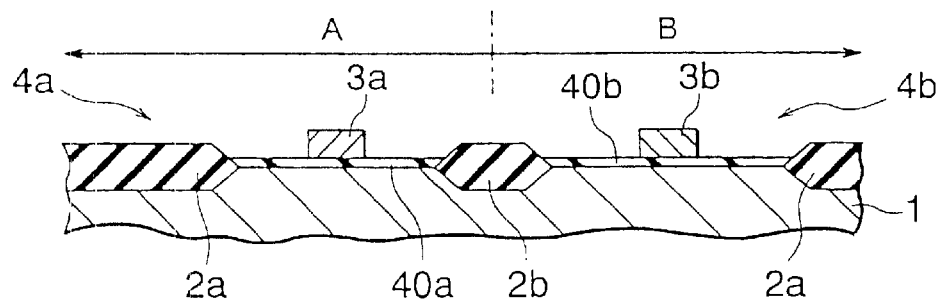
FIGS. 3A through 3E are sectional views showing, in order of steps, the method of fabricating a semiconductor device having a ferroelectric capacitor according a third embodiment of the present invention.

Like the first embodiment, transistors 4a and 4b are initially formed on a silicon substrate 1 in a ferroelectric memory region A and a logic circuit region B, respectively, as shown in FIG. 3A. More specifically, element isolation insulating films 2a and 2b are formed on the surface of the silicon substrate 1. Gate insulating films 40a, 40b and gate electrodes 3a, 3b are formed on the silicon substrate 1 in the regions surrounded by the element isolation insulating films 2a and 2b. Besides, with the gate electrodes 3a and 3b as the masks, ion implantation is applied to the surface of the silicon substrate 1 to form diffusion layers (shown in FIG. 1A) that constitute source and drain regions.

Figure 3B:
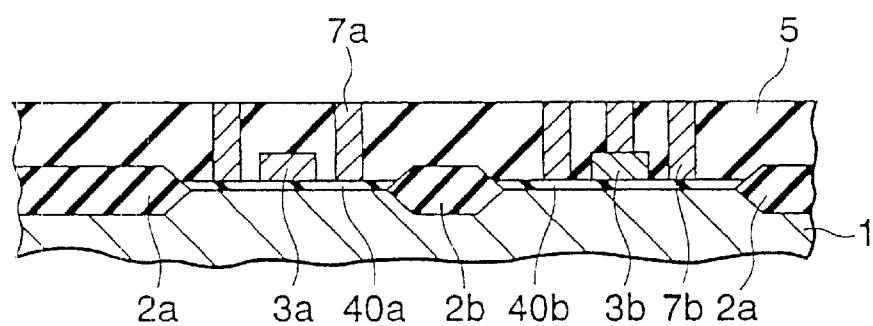

Then, as shown in FIG. 3B, an interlayer insulating film 5 is formed on these transistors. Through holes for establishing connection with the diffusion layers and the electrode, and the like are formed therein, and are filled with tungsten, polysilicon, or other conductives to form contacts 7a and 7b.

Figure 3C:
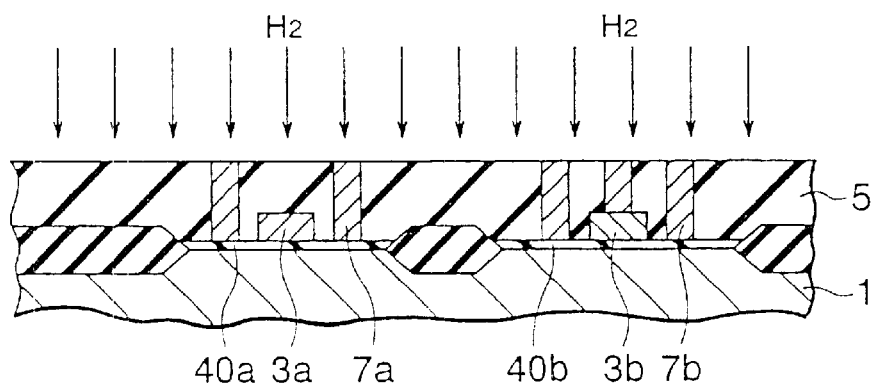

In this embodiment, as shown in FIG. 3C, a first heat treatment is performed here in a hydrogen atmosphere or a nitrogen-or otherwise-diluted hydrogen atmosphere at 300–500° C. or so for about 5–60 minutes.

Figure 3D:
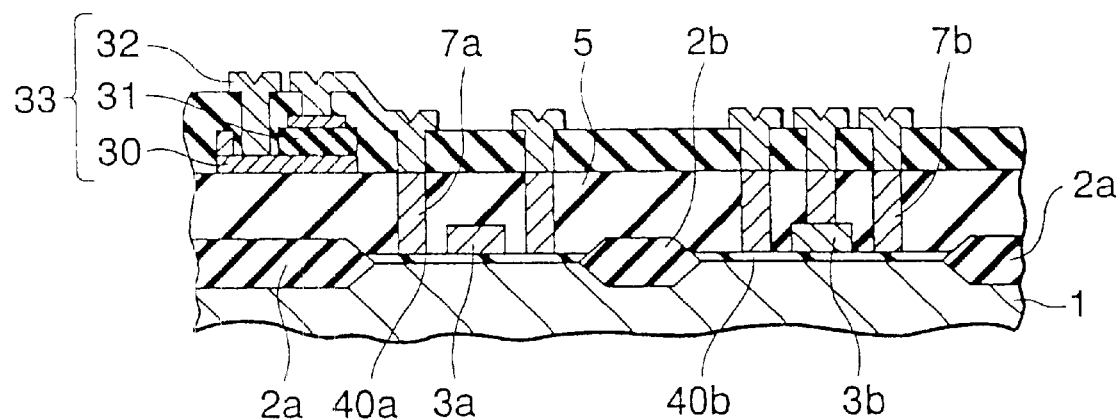

Thereafter, as shown in FIG. 3D, a ferroelectric capacitor 33 composed of a lower electrode 30, a ferroelectric film 31, and an upper electrode 32 is formed on the interlayer insulating film 5 in the ferroelectric memory region A. The ferroelectric capacitor can be formed in the same manner as that of the first embodiment. Note that in the present embodiment, the upper electrode 32 of the ferroelectric capacitor 33 is formed selectively for the sake of forming a wiring that establishes connection with the lower electrode 30. Subsequently, an insulating film 34 is formed over the entire surface, followed by the formation of contacts 7a, 7b and wirings 35 for establishing connection with the upper and lower electrodes 32 and 30 of the ferroelectric capacitor 33. Here, the contact 7a connected to either one of the diffusion layers in the ferroelectric memory region A is connected to the upper electrode 32 of the ferroelectric capacitor 33.

Figure 3E:
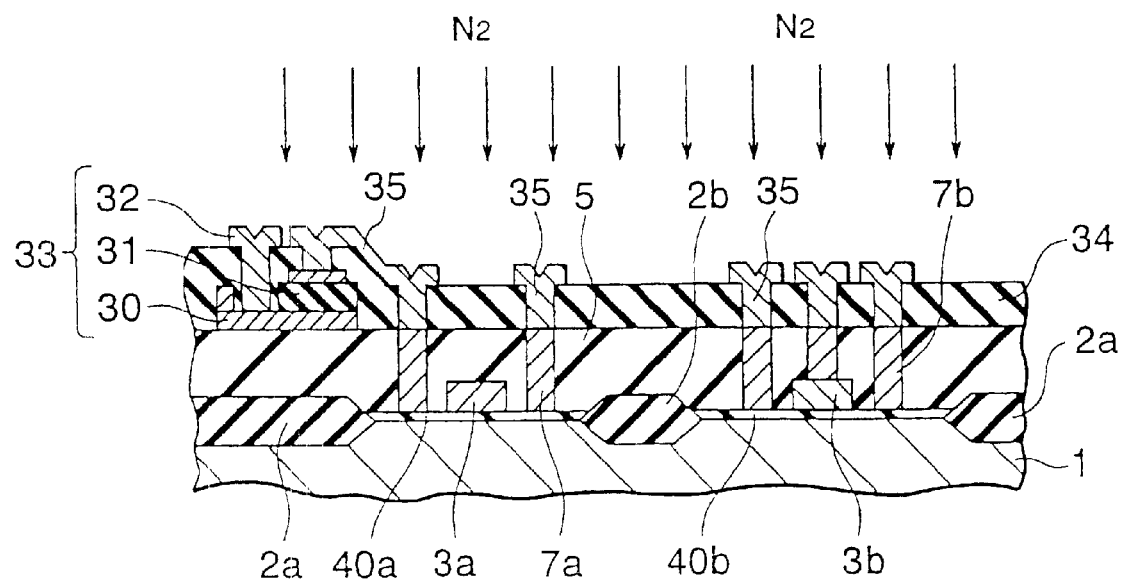

Then, as shown in FIG. 3E, a second heat treatment is performed in a nitrogen atmosphere at a temperature of the order of 300–500° C. for about 5–60 minutes.

In the present embodiment, the ferroelectric capacitor is formed before the wiring step. This makes it possible to perform a heat treatment of the order of 600° C. in the formation of the ferroelectric capacitor, thereby facilitating the formation of the ferroelectric film. Even in this case, the first heat treatment in hydrogen is performed once before the formation of the ferroelectric capacitor, thereby making the subsequent second heat treatment, or nitrogen treatment, extremely effective.

Incidentally, the present embodiment has dealt with the case where the ferroelectric capacitor is formed not on a contact but in the vicinity of the contact so that the contact and the ferroelectric capacitor are connected to each other via a wiring. It.is understood, however, that the same effects can be obtained even if the lower electrode of the ferroelectric capacitor is formed on the contact.

As has been detailed above, according to the present invention, defects developed in oxide films or in interfaces of electrodes, oxide films, and the like during fabrication processes can be recovered by the first heat treatment in a hydrogen atmosphere which precedes the formation of a ferroelectric capacitor and the second heat treatment in a nitrogen atmosphere which follows the formation of the ferroelectric capacitor. That is, the first heat treatment completely recovers the defects mentioned above while the second heat treatment can recover the defects occurring in the step of forming the ferroelectric capacitor. As a result, the defects occurring in the fabrication processes can be recovered without deterioration of the ferroelectric capacitor, whereby preferable transistor characteristics can be obtained.

What is claimed is:

1. A method of fabricating a semiconductor device having a ferroelectric capacitor, said ferroelectric capacitor including a ferroelectric film as its dielectric, the method comprising the steps of:

performing a first heat treatment in a hydrogen-containing atmosphere to recover a defect occurring in a film forming step;

subsequent to said first heat treatment step, forming said ferroelectric capacitor; and performing a second heat treatment in a nitrogen atmosphere to recover a defect occurring in the step of forming said ferroelectric capacitor.

2. The method of fabricating a semiconductor device having a ferroelectric capacitor according to claim 1, wherein said first and second heat treatments are performed at a temperature of 300–500° C.

3. A method of fabricating a semiconductor device having a ferroelectric capacitor, said ferroelectric capacitor including a ferroelectric film as its dielectric, the method comprising the steps of:

performing a first heat treatment in a hydrogen-containing atmosphere to recover a defect occurring in a film forming step;

forming said ferroelectric capacitor; and performing a second heat treatment in a nitrogen atmosphere to recover a defect occurring in the step of forming said ferroelectric capacitor, wherein before the step of performing said first heat treatment, forming a MOS transistor on the surface of a silicon substrate, and forming a first insulating film on said MOS transistor and forming a contact connected to a diffusion layer of said MOS transistor; and between the step of performing said first heat treatment and the step of performing said second heat treatment, forming a lower electrode on said first insulting film, a ferroelectric film thereon, and an upper electrode thereon to form a ferroelectric capacitor, said lower electrode being connected to said contact, and forming a second insulating film over the entire surface and forming a wiring for establishing connection between said contact and said upper electrode.

4. The method of fabricating a semiconductor device having a ferroelectric capacitor according to claim 3, further comprising the step of forming a plurality of wiring layers on said first insulating film between the step of forming said contact and the step of performing said first heat treatment.

5. The method of fabricating a semiconductor device having a ferroelectric capacitor according to claim 4, wherein said first and second heat treatments are performed at a temperature of 300–500° C.

6. The method of fabricating a semiconductor device having a ferroelectric capacitor according to claim 3, wherein said first and second heat treatments are performed at a temperature of 300–500° C.

7. A method of fabricating a semiconductor device having a ferroelectric capacitor, said ferroelectric capacitor including a ferroelectric film as its dielectric, the method comprising the steps of:

performing a first heat treatment in a hydrogen-containing atmosphere to recover a defect occurring in a film forming step;

forming said ferroelectric capacitor; and performing a second heat treatment in a nitrogen atmosphere to recover a defect occurring in the step of forming said ferroelectric capacitor, wherein before the step of performing said first heat treatment,
forming a MOS transistor on the surface of a silicon substrate,
forming a first insulating film on said MOS transistor, and
forming a contact connected to a diffusion layer in said MOS transistor; and,
between the step of performing said first heat treatment and the step of performing said second heat treatment,
forming a ferroelectric capacitor composed of a lower electrode on said first insulating film, a ferroelectric film thereon, and an upper electrode thereon, and
forming a second insulating film and forming a wiring for establishing connection between said contact and said upper electrode.

8. The method of fabricating a semiconductor device having a ferroelectric capacitor according to claim 7, wherein said lower electrode of said ferroelectric capacitor is connected to said contact.

9. The method of fabricating a semiconductor device having a ferroelectric capacitor according to claim 8, wherein said first and second heat treatments are performed at a temperature of 300–500° C.

10. The method of fabricating a semiconductor device having a ferroelectric capacitor according to claim 7, wherein said first and second heat treatments are performed at a temperature of 300–500° C.

* * * * *